United States Patent [19]

Lee

[11] Patent Number: 5,705,047

[45] Date of Patent: Jan. 6, 1998

[54] METHOD FOR MANUFACTURING POROUS BLUE LIGHT EMITTING DIODE

[75] Inventor: Ming-Kwei Lee, Kaohsiung, Taiwan

[73] Assignee: National Science Council, Taipei, Taiwan

[21] Appl. No.: 631,271

[22] Filed: Apr. 12, 1996

Related U.S. Application Data

[63] Continuation-in-part of Ser. No. 235,830, Apr. 29, 1994, abandoned.

[51] Int. Cl.$^6$ .......................... H01L 33/00; C25D 11/02
[52] U.S. Cl. .................. 205/123; 205/157; 205/224; 205/666; 437/15; 437/23; 437/170; 437/905
[58] Field of Search ................... 205/123, 124, 205/157, 223, 224, 229, 666; 437/15, 23, 170, 181, 228, 248, 905

[56] References Cited

U.S. PATENT DOCUMENTS

| | | | |
|---|---|---|---|
| 4,643,804 | 2/1987 | Lynch et al. | 204/15 |
| 4,666,569 | 5/1987 | Basol | 204/34.5 |
| 4,931,149 | 6/1990 | Stierman et al. | 204/15 |
| 5,272,355 | 12/1993 | Namavar et al. | 257/3 |
| 5,275,715 | 1/1994 | Tuttle | 205/123 |
| 5,298,767 | 3/1994 | Shor et al. | 257/77 |
| 5,331,180 | 7/1994 | Yamada et al. | 257/3 |
| 5,376,825 | 12/1994 | Tukamoto et al. | 257/685 |
| 5,420,049 | 5/1995 | Russell et al. | 437/24 |
| 5,444,296 | 8/1995 | Kaul et al. | 257/686 |
| 5,444,298 | 8/1995 | Schutz | 257/691 |
| 5,501,787 | 3/1996 | Bassous et al. | 205/124 |

OTHER PUBLICATIONS

Hou, X.Y. et al, Large blue shift of light emitting porous silicon by boiling water treatment, *Appl. Phys. Lett.*, 62(10), 8 Mar. 1993, pp. 1097–1098.

Koshida, N. et al, Visible electroluminescence from porous silicon, *Appl. Phys. Lett.*, vol. 60, No. 3, 20 Jan. 1992, pp. 347–349.

Steiner, P. et al, New Results on Electroluminescence from Porous Silicon, *Mat. Res. Symp. Proc.*, vol. 283, 1993, pp. 343–351.

*Primary Examiner*—Kathryn L. Gorgos
*Assistant Examiner*—William T. Leader
*Attorney, Agent, or Firm*—Barnes, Kisselle, Raisch, Choate, Whittemore & Hulbert, P.C.

[57] ABSTRACT

A method for manufacturing a porous blue light emitting diode comprising the steps of preparing a silicon substrate having a back surface, applying a conducting layer on the back surface, annealing the substrate coated with the conducting layer in an inert gas atmosphere, applying an anti-corrosion layer on the conducting layer, immersing the anti-corrosion layer-applied substrate in a hydrofluoric acid aqueous solution with a concentration of about 5% by volume, applying a voltage to the resulting layers for eroding the anti-corrosion layer-applied substrate to form a porous layer having Si wires on a top surface of the substrate, and oxidizing the porous layer for making sizes of the Si wires small enough for emitting light having a peak occuring at a wavelength shorter than about 520 nm. This method offers a simple and feasible way to fabricate a porous blue light emitting diode.

14 Claims, 6 Drawing Sheets

METHOD FOR MANUFACTURING POROUS BLUE LIGHT EMITTING DIODE

FIELD OF THE INVENTION

This is a continuation-in-part application of U.S. patent application Ser. No. 08/235,830, filed on Apr. 29, 1994, now abandoned, and entitled Method For Manufacturing Porous Blue Light Emitting Diode. This invention relates generally to a method for manufacturing a blue light emitting diode, and more particularly to a method for manufacturing a porous silicon blue light emitting diode.

BACKGROUND OF THE INVENTION

The necessity of utilizing a short-wavelength light source, such as a blue light source, for high density optical information treatment and high quality image processing is progressively growing due to less time for accessing a large amount of data performed by the short-wavelength light source. Furthermore, blue light emitting diodes (LEDs), when combined with well-developed green and red LEDs, can be used to fabricate a display system enabling all colors to be displayed. Therefore, blue LEDs are much more valuable in the applications of various industries. There are many unsolved problems in doping the priorly reported materials, such as ZnSe or GaN, for fabricating blue LEDs, and the technique thereof is still problematic. Fabrication of a ZnSe or GaN blue LED has the following shortcomings:

1. Difficulties with respect to doping;
2. High manufacturing costs; and
3. Poor matchability with other devices in optical IC applications.

A well-known semi-conductor material is Si. Its development on individual devices, IC, or VLSI has been well-performed. However, a fatal drawback of Si for fabricating an effective optical device is that Si has an indirect band gap which results in its disability for emitting light. After the technique of porous Si has been disclosed, it is possible to transform the indirect band gap of Si into a direct band gap due to the change on its micro-structure. There have been successfully fabricated red and orange LEDs whereas the fabrication of a blue LED has not been reported yet.

Yamada et al. (U.S. Pat. No. 5,331,180) disclose a process for making a porous semiconductor light emitting device which includes the steps of preparing a silicon substrate, applying a conductive layer, e.g. of aluminum, to the back surface of the substrate, immersing the substrate in a solution of hydrofluoric acid, applying an electric current to anodically oxidize the substrate to thereby form a porous region containing silicon wires on the surface of the substrate, and oxidizing the substrate in an oxidizing atmosphere.

Yamada et al. also suggest that the wavelength of emitted light can be shifted to blue by means of a pure water treatment. However, there exists no evidence to support this point in Yamada et al.'s specification.

Blue light has a wavelength range from 450 to 500 nm. Referring to FIG. 5A of Yamada et al. which is a graph showing the change in photoluminescence peak wavelength relative to the immersion time in pure water, it is obvious that only the sample PL3 shows the tendency to enter the wavelength range of blue light. Further referring to column 10, lines28–29 of Yamada et al.'s specification, the wavelength of the light emitted from sample PL3 changed from about 770 nm to 560 nm during three hours of pure water treatment, and a sample immersed in pure water for four hours radiated no light. That is, no blue light is emitted from the above samples. In other words, it is not obvious for one who is skilled in the art to manufacture a porous blue light emitting diode only in view of the disclosure of specification of Yamada et al.

SUMMARY OF THE INVENTION

An objective of the present invention is to offer a feasible way to fabricate a blue LED.

Another objective of the present invention is to offer a simple way to fabricate a blue LED.

Another objective of the present invention is to offer an economical way to fabricate a blue LED.

Another objective of the present invention is to offer a process for fabricating a porous Si blue LED having an excellent compatibility between the heterojunction interface of the porous Si and the Si substrate.

In accordance with the present invention, a method for manufacturing a porous blue light emitting diode comprises preparing a substrate having a back surface, applying a conducting layer on the back surface by plating or evaporation, annealing the substrate coated with the conducting layer in an inert gas atmosphere, applying an anti-corrosion layer on the conducting layer by coating, immersing the anti-corrosion layer-applied substrate in a first solution, eroding the anti-corrosion layer-applied substrate by applying an appropriate voltage thereto to obtain a porous layer thereon, oxidizing the porous layer, removing an oxidized layer formed on the surface of the oxidized porous layer by utilizing a second solution which may be a hydrofluoric acid aqueous solution, and applying a thin film of semi-transparent gold by evaporating to obtain a porous blue light emitting diode.

In accordance with another aspect of the present invention, each of the first and the second solutions includes a hydrofluoric acid aqueous solution being in a concentration of about 5% or a hydrofluoric acid-containing solution such as a hydrofluoric acid and acetic acid mixing solution.

In accordance with another aspect of the present invention, the substrate is made of a material selected from a group consisting of Si, Ge, and SiGe.

In accordance with another aspect of the present invention, the porous blue light emitting diode has a threshold voltage of about 12 Volts.

In accordance with another aspect of the present invention, the conducting layer is made of Al.

In accordance with another aspect of the present invention, the inert gas is nitrogen.

In accordance with another aspect of the present invention, the annealing step is executed at about 450° C. and for about 10 minutes.

In accordance with another aspect of the present invention, the anti-corrosion layer is made of black wax.

In accordance with another aspect of the present invention, the eroding step is executed for about 20 minutes under a current density of about 2.5 mA/cm$^2$.

In accordance with another aspect of the present invention, the oxidizing step is executed in a relatively high temperature furnace of about 1100° C. and for about 10 minutes.

The present invention may best be understood through the following description with reference to the accompanying drawings, in which:

DETAILED DESCRIPTION OF THE PREFERRED EMBODIMENT

Porous Si is a novel material having a direct band gap. It is produced by eroding a surface of Si to form thereon a porous Si surface. The band gap thereof will thus be transformed from an indirect one into a direct one through a folding effect. The width of the band gap is a function of its wire size. Theoretically, when a material has a wire size of about 14 Å, its band gap possesses a capability of emitting blue light. By prior eroding techniques to obtain a product having such a thin wire size, the wire density of the obtained product is too low or the Si wires thereon tend to collapse when taken away from an immersing liquid so that the product is incapable of emitting blue light a sufficiently high luminous intensity.

This invention features taking away a porous Si workpiece from the immersing liquid before the Si wire size is thin enough to emit blue light, thus preventing collapse of the Si wires, to maintain a sufficiently high wire density for emitting light of enough luminous intensity, and properly introducing an oxidation process therefor which can thus make the Si wires thereon thin enough to emit blue light, sustain the Si wire strength therefor by the formation of silicon oxide so as to prevent the Si wires from collapsing, and maintain therefor a high wire density. The property of emitting blue light of the product is thereby assured. Furthermore, a suitable porosity of the porous Si is obtainable by a specific concentration of the liquid and the application of a current having a specific density.

Figure 1:
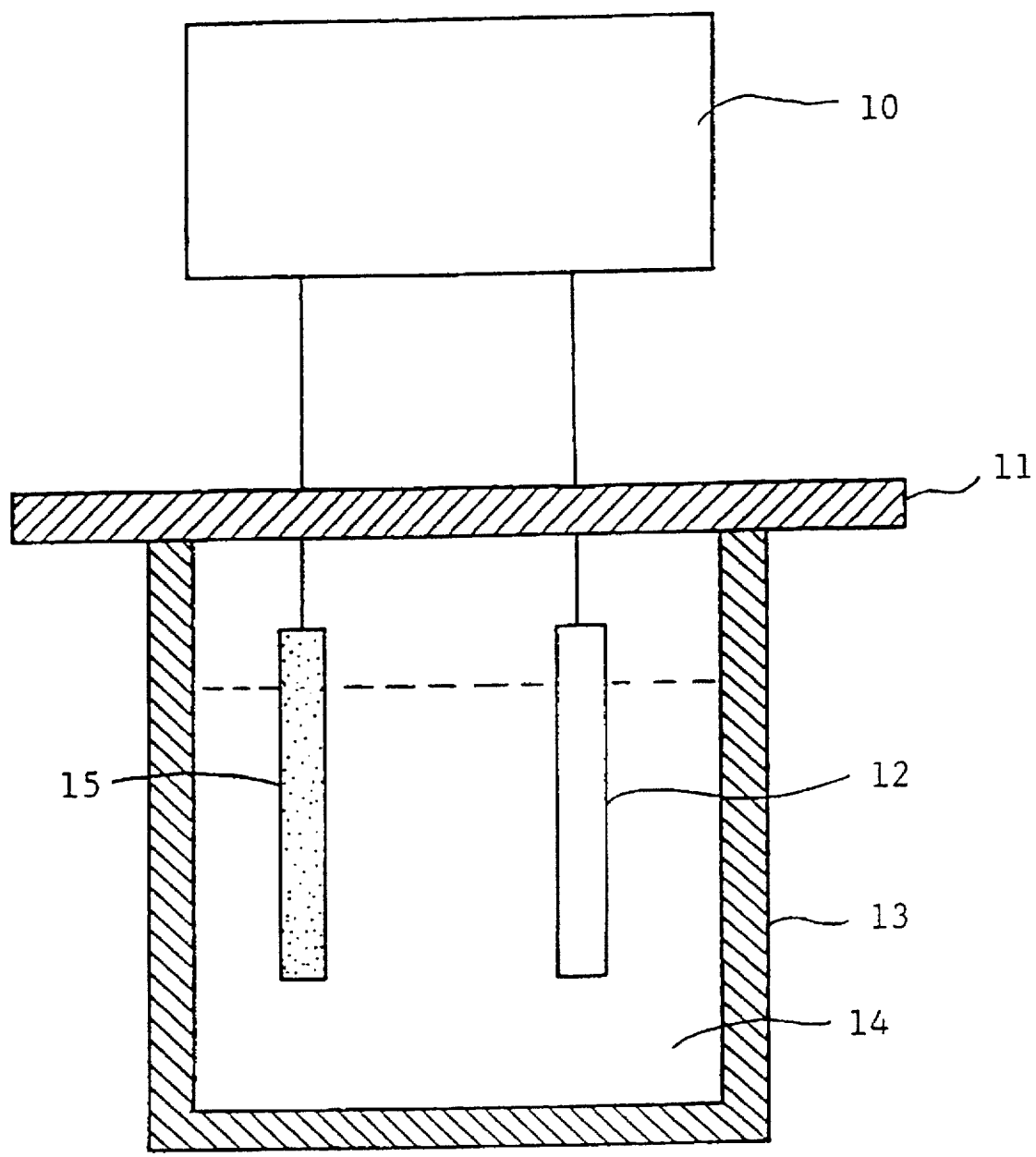
FIG. 1 is a schematic view of an anode eroding apparatus for a porous Si blue LED according to this invention.

FIG. 1 shows an anode eroding apparatus according to this invention comprising a power source 10, a Teflon holder 11, a platinum cathode 12, and a Teflon beaker 13 containing an electrolyte of hydrofluoric acid aqueous solution or a hydrofluoric acid-containing solution such as a hydrofluoric acid and acetic acid mixing solution. A wax-coated Si substrate 15 is immersed into the electrolyte to proceed an eroding process.

The present invention will now be described more specifically with reference to the following examples. It is to be noted that the following descriptions of examples including preferred embodiments of this invention are presented herein for purpose of illustration and description only; it is not intended to be exhaustive or to be limited to the precise form disclosed.

EXAMPLE 1

Figure 2:
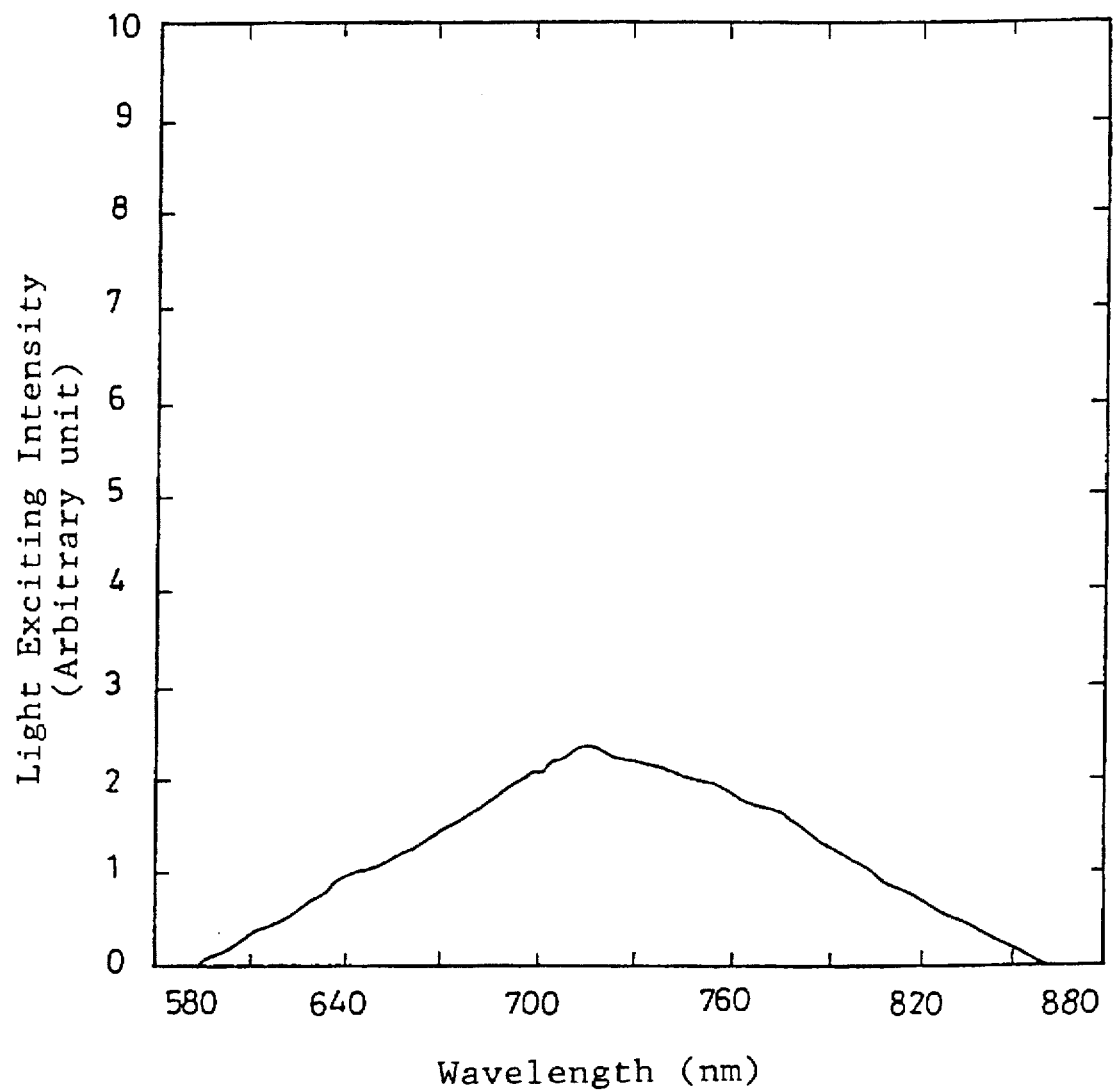
FIG. 2 is a spectrum diagram of porous Si after an anode eroding step according to this invention.
Figure 3:
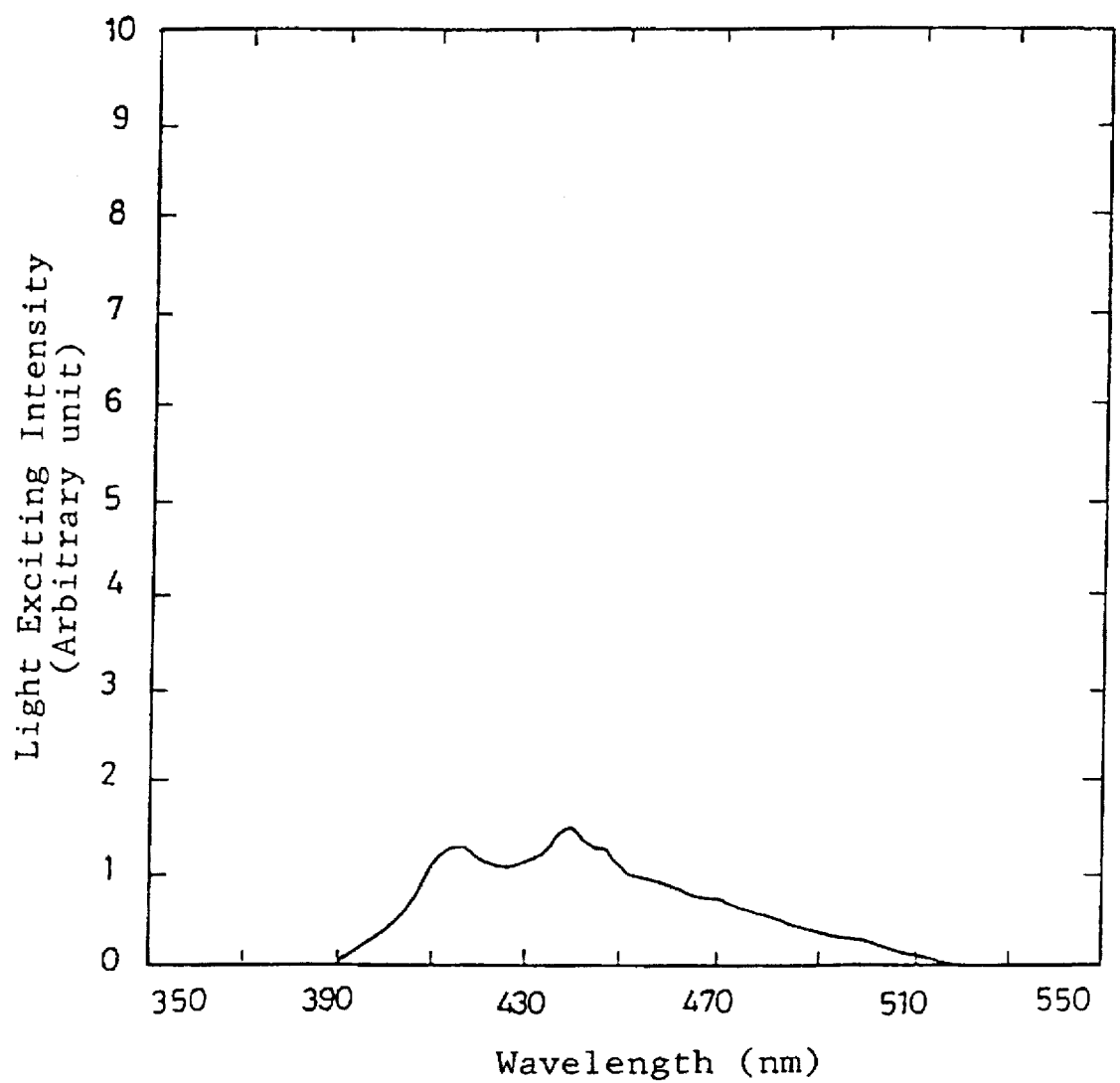
FIG. 3 is a spectrum diagram of oxidized porous Si after an anode eroding step according to this invention.

Take (100) Si having a resistance of about 25–45 cm as a substrate and plate Al to the back surface of the Si substrate. The Si substrate is then subjected to an annealing process for about 10 minutes. After being coated with wax, the Si substrate is placed into a 5% by volume hydrofluoric acid aqueous solution to perform an anode eroding process for about 20 minutes, wherein the input current for eroding the Si substrate is kept at a current density of about 2.5 mA/cm$^2$, to obtain a porous Si layer on the Si substrate. The porous Si specimen is subjected to a light exciting test. The obtained spectrum for the porous Si specimen from the test, as shown in FIG. 2, has a major peak occurring at a wavelength of about 700 nm. This wavelength lies in the red light zone. The porous Si specimen is further subjected to an oxidation process in a high temperature furnace at about 1100° C. for about 10 minutes to obtain the desired porous Si device. The occurrence of the main peak in the spectrum of the obtained porous Si device from the light exciting test, as shown in FIG. 3, shifts to a wavelength of about 400 nm which lies in the blue light zone, by which we can ascertain the capability of emitting blue light of the obtained porous Si device.

Figure 4:
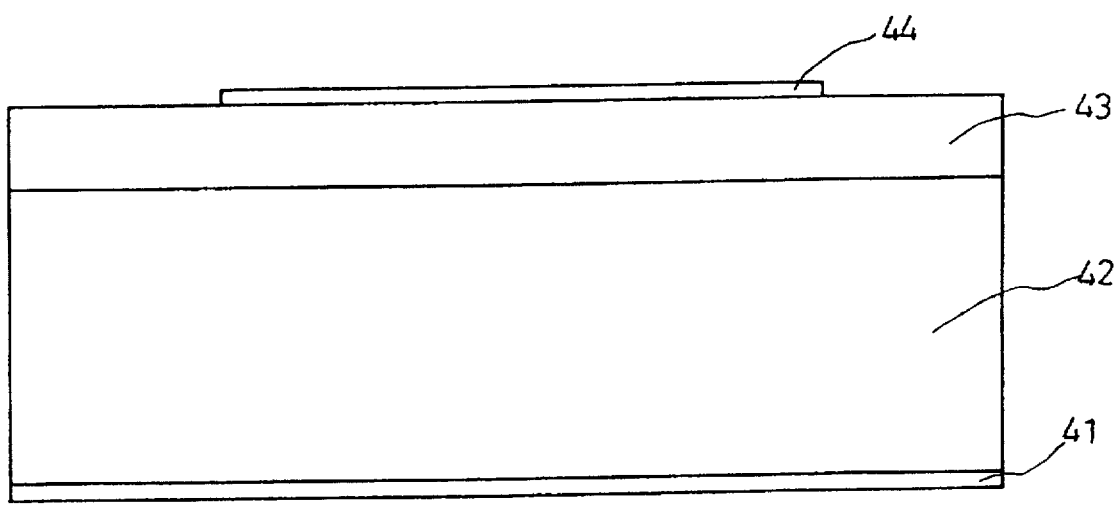
FIG. 4 is a cross-sectional view of a porous Si blue LED according to this invention.

The structure of the obtained porous Si device, as shown in FIG. 4, comprises a Si substrate 42, an Al layer 41 on the back surface of the Si substrate 42, an oxidized porous Si layer 43 on the top surface of the Si substrate 42, and a transparent Au layer 44 on the oxidized porous Si layer 43.

Figure 5:
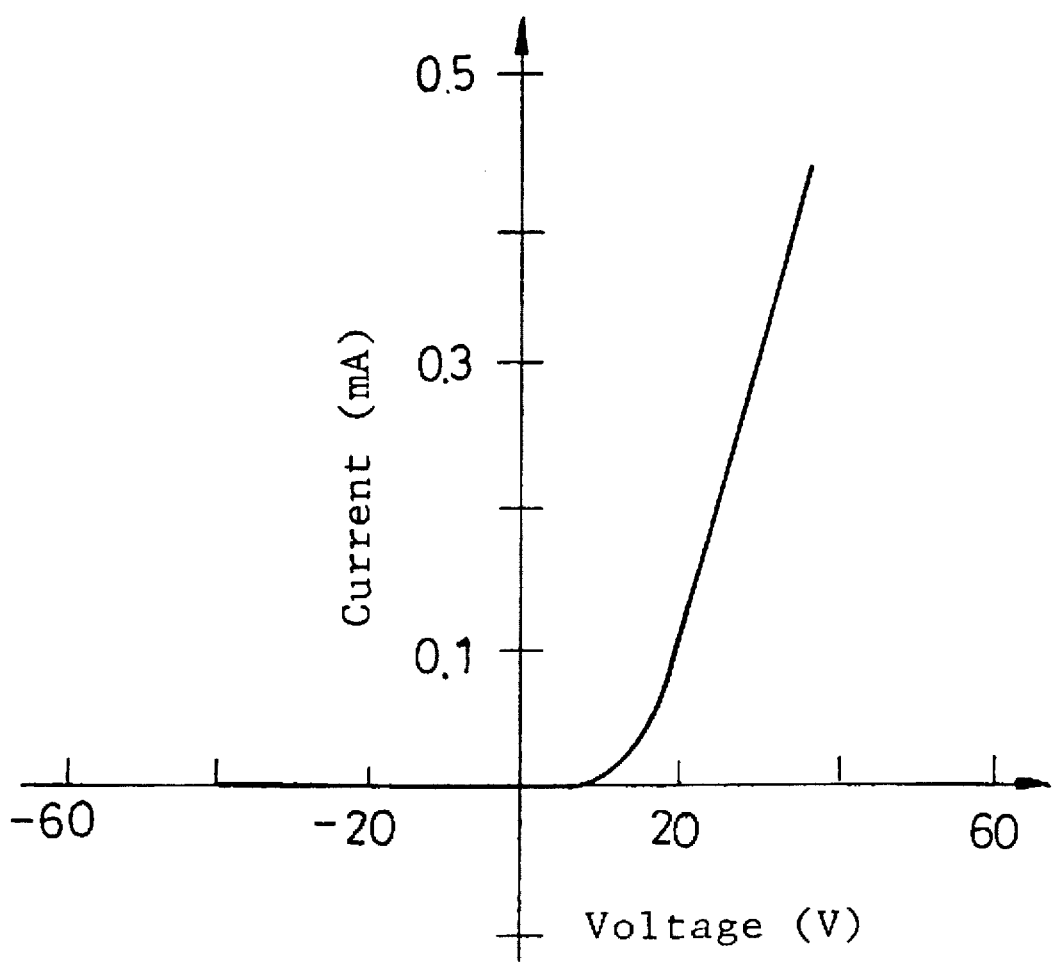
FIG. 5 is a current vs. voltage characteristic curve of a porous Si blue LED according to this invention.

The obtained porous Si device is further analyzed by its current-voltage characteristic curve, as shown in FIG. 5, which shows a threshold voltage of about 12 Volts and a perfect curve for a blue LED.

According to the present invention, a porous Si blue LED is obtained without a pure water treatment suggested by Yamada et al. Furthermore, all conditions disclosed in Yamada et al.'s specification cannot lead to obtain a blue LED. Referring to FIG. 3 of Yamada et al., the main peak of the light emission spectrum is located between 600 and 650 nm, which is far away from the range of blue light.

Figure 6:
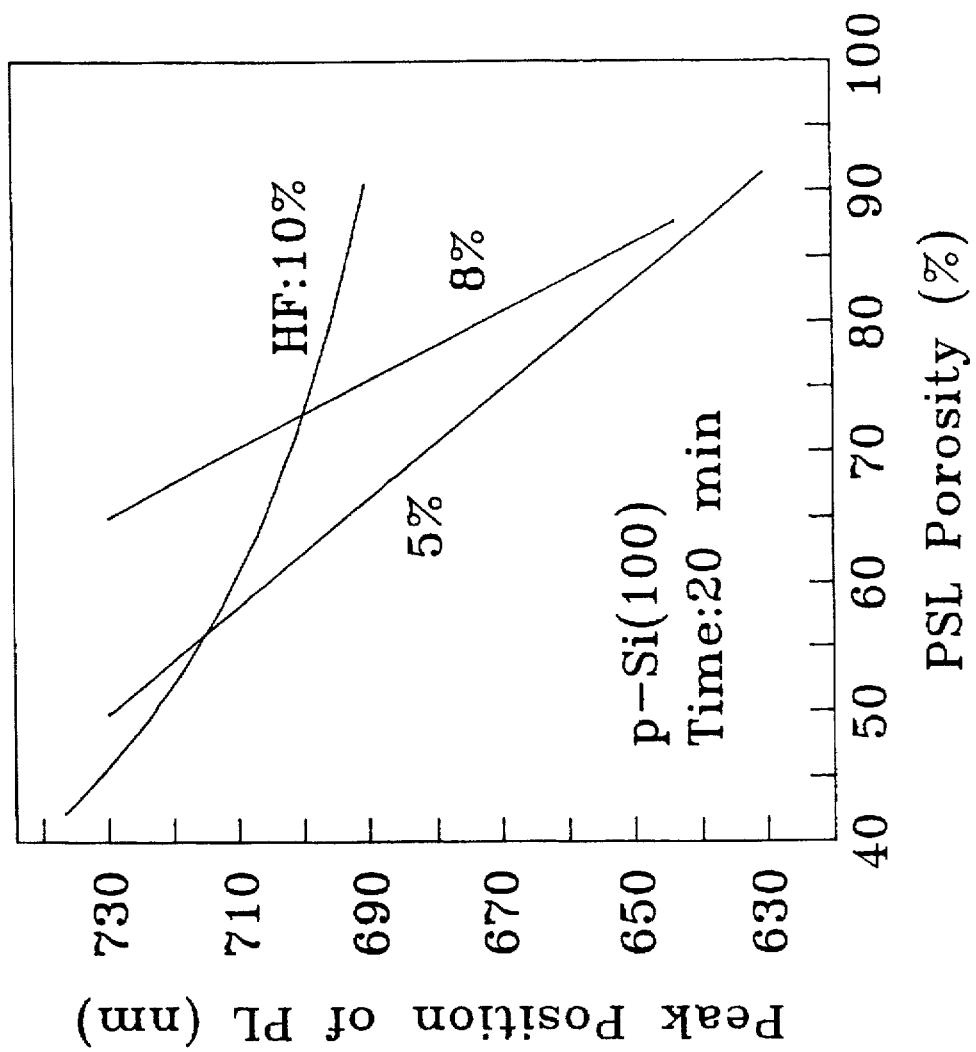
FIG. 6 is an illustration of peak position of photoluminescence spectra of PSL (porous Si layer) as a function of PSL porosity in different HF concentrations for anodic time of 20 minutes.

An essential point for emitting blue light is the concentration of HF solution. It is shown in FIG. 6 in which the peak position of a high HF concentration PSL is far from the blue light range. Accordingly, a 5% by volume HF concentration is chosen for manufacturing a blue LED. Porous Si obtained from a 5% HF solution has suitable porosity and Si wire density for manufacturing a blue LED, and is capable of emitting blue light after an oxidizing process. Yamada uses a 10 to 48 weight % HF ( see Col. 6, line 56 and Col. 9, lines 51–61), so the peak position is too far from the blue light range. Even after the thermal oxidization or pure water treatment, the Si wire size is still too large to emit blue light.

Yamada never shows that a blue LED can be obtained directly after the oxidization. Instead, an additional pure water treatment is needed as per Yamada's suggestion. It is hard to believe that Yamada can obtain a blue LED directly from a routine optimization since a blue LED is a long-felt need for LED manufacturers. The HF concentration and the current density influence the porosity, the wire size and the wire density of a porous Si layer, which are key points for a porous Si LED to emit blue light. That is to say, it is totally unobviously for one skilled in the art to manufacture a porous Si blue LED without teaching by the present invention.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for manufacturing a porous blue light emitting diode comprising the steps of:

(a) preparing a silicon substrate having a top surface and a back surface;

(b) applying a conducting layer on said back surface;

(c) annealing said substrate coated with said conducting layer in an inert gas atmosphere;

(d) applying an anti-corrosion layer on said conducting layer;

(e) immersing said anti-corrosion layer-applied substrate in a hydrofluoric acid aqueous solution with a concentration of about 5% by volume;

(f) applying a voltage between a cathode and said substrate to produce a current density of about 2.5 mA/cm$^2$ for about 20 minutes to erode said substrate and form a porous layer having Si wires on said top surface of said substrate; and (g) oxidizing said porous layer in a furnace for making sizes of said Si wires small enough for emitting light having a peak occurring at a wavelength shorter than about 520 nm.

2. A method for manufacturing a porous blue light emitting diode as claimed in claim 1, wherein said step (g) is further followed by a step (h) of removing a surface portion of said oxidized porous layer in said step (g) by utilizing a second solution.

3. A method for manufacturing a porous blue light emitting diode as claimed in claim 2, wherein said second solution is a hydrofluoric acid aqueous solution.

4. A method for manufacturing a porous blue light emitting diode as claimed in claim 2, wherein said step (h) is further followed by a step (i) of applying a thin film of semi-transparent gold onto said oxidized porous layer to obtain said porous blue light emitting diode.

5. A method for manufacturing a porous blue light emitting diode as claimed in claim 4, wherein said step (i) is executed by evaporating.

6. A method for manufacturing a porous blue light emitting diode as claimed in claim 1, wherein said porous blue light emitting diode has a threshold voltage of about 12 Volts.

7. A method for manufacturing a porous blue light emitting diode as claimed in claim 1, wherein said conducting layer is made of Al.

8. A method for manufacturing a porous blue light emitting diode as claimed in claim 1, wherein said inert gas is nitrogen.

9. A method for manufacturing a porous blue light emitting diode as claimed in claim 1, wherein said step (c) is executed at about 450° C.

10. A method for manufacturing a porous blue light emitting diode as claimed in claim 1, wherein said step (c) is executed for about 10 minutes.

11. A method for manufacturing a porous blue light emitting diode as claimed in claim 1, wherein said anti-corrosion layer is made of black wax.

12. A method for manufacturing a porous blue light emitting diode as claimed in claim 1, wherein said step (g) is executed in said furnace at a temperature of about 1100° C.

13. A method for manufacturing a porous blue light emitting diode as claimed in claim 12, wherein said step (g) is executed for about 10 minutes.

14. A method for manufacturing a porous blue light emitting diode as claimed in claim 1, wherein said step (b) is executed by evaporating.

* * * * *